United States Patent
Wang et al.

(10) Patent No.: US 8,212,235 B2
(45) Date of Patent: Jul. 3, 2012

(54) NANOWIRE-BASED OPTO-ELECTRONIC DEVICE

(75) Inventors: Shih-Yuan Wang, Palo Alto, CA (US); M. Saif Islam, Davis, CA (US); Philip J. Kuekes, Menlo Park, CA (US); Nobuhiko Kobayashi, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1469 days.

(21) Appl. No.: 11/790,446

(22) Filed: Apr. 25, 2007

(65) Prior Publication Data

US 2011/0249322 A1     Oct. 13, 2011

(51) Int. Cl.
 *H01L 29/06* (2006.01)
(52) U.S. Cl. .............. 257/14; 257/12; 257/E29.005; 977/762
(58) Field of Classification Search ............ None
See application file for complete search history.

(56) References Cited

U.S. PATENT DOCUMENTS

| | | |
|---|---|---|
| 6,788,453 B2 | 9/2004 | Banin et al. |
| 6,914,256 B2 | 7/2005 | Zhang et al. |
| 6,996,147 B2 | 2/2006 | Majumdar et al. |
| 2002/0172820 A1 | 11/2002 | Majumdar et al. |
| 2005/0064731 A1 | 3/2005 | Park et al. |
| 2005/0133476 A1 | 6/2005 | Islam et al. |
| 2005/0164432 A1 | 7/2005 | Lieber et al. |
| 2006/0097389 A1 | 5/2006 | Islam et al. |
| 2006/0098705 A1 | 5/2006 | Wang et al. |
| 2006/0280414 A1 | 12/2006 | Beausoleil et al. |

FOREIGN PATENT DOCUMENTS

KR    10-2004-47777    6/2004

OTHER PUBLICATIONS

R. Agarwal and C.M. Lieber, "Semiconductor nanowires: optics and optoelectronics," *Applied Physics A*, vol. 85, pp. 209-215 (2006).
Jr H. He, S. T. Ho, T. B. Wu, L. J. Chen and Z. L. Wang, "Electrical and photoelectrical performances of nano-photodiode based on ZnO nanowires," *Chemical Physics Letters*, vol. 435, pp. 119-122 (2007).
O. Hayden, R. Agarwal and C. M. Lieber, "Nanoscale avalanche photodiodes for highly sensitive and spatiallly resolved photon detection," *Nature Materials*, vol. 5, pp. 352-356 (May 2006).
L. Luo, Y. Zhang, S. S. Mao and L. Lin, "Fabrication and characterization of ZnO nanowires based UV photodiodes," *Sensors and Actuators A*, vol. 127, pp. 201-206 (2006).
B.J. Ohlsson, M.T. Björk, M.H. Magnusson, K. Deppert, L. Samuelson and L.R. Wallenberg, "Size-, shape-, and position-controlled GaAs nano-whiskers," *Applied Physics Letters*, vol. 79, No. 20, pp. 3335-3337 (Nov. 11, 2001).
M.H. Huang, S. Mao, H. Feick, H. Yan, Y. Wu, H. Kind, E. Weber, R. Russo and P. Yang, "Room-Temperature Ultraviolet Nanowire Nanolasers," *Science*, vol. 292, pp. 1897-1899 (Jun. 8, 2001).

(Continued)

*Primary Examiner* — Seahvosh Nikmanesh

(57) ABSTRACT

Nanowire-based opto-electronic devices including nanowire lasers, photodetectors and semiconductor optical amplifiers are disclosed. The devices include nanowires grown from single crystal and/or non-single surfaces. The semiconductor optical amplifiers include nanowire arrays that act as ballast lasers to amplify a signal carried by a signal waveguide. Embodiments of the nanowire lasers and photodetectors include horizontal and vertical nanowires that can provide different polarizations.

8 Claims, 5 Drawing Sheets

OTHER PUBLICATIONS

S.S. Yi, G. Girolami, J. Adamo, M. S. Islam, S. Sharma, T.I. Kamins and I. Kimukim, "InP nanobridges epitaxially formed between two vertical Si surfaces by metal-catalyzed chemical vapor deposition," *Applied Physics Letters*, vol. 89, pp. 133121 (2006).

H. Yan, R. He, J. Johnson, M. Law, R. J. Saykally and P. Yang, "Dendritic Nanowire Ultraviolet Laser Array," *J. Am. Chem. Soc.*, vol. 125, No. 16, pp. 4728-4729 (2003).

T. Kamins, "Beyond CMOS Electronics: Self-Assembled Nanostructures," The Electrochemical Society *Interface*, pp. 46-49, Spring 2005.

M. S. Islam, S. Sharma, T.I. Kamins and R. S. Williams, "Ultrahigh-Density Silicon Nanobridges Formed Between Two Vertical Silicon Surfaces," *Nanotechnology* 15, L5-L8 (2004).

M.T. Bjork, B.J. Ohlsson, T. Sass, A.I. Persson, C. Thelander, M.H. Magnusson, K. Deppert, L. R. Wallenberg and L. Samuelson; "One-dimensional Steeplechase for Electrons Realized," *Nano Letters*, vol. 2, No. 2, pp. 87-89 (2002).

T.I. Kamins, X. Li and R. S. Williams, "Growth and Structure of Chemically Vapor Deposited Ge Nanowires on Substrates," *Nano Letters*, vol. 4, No. 3, pp. 503-506 (2004).

S. Sharma, T.I. Kamins and R. S. Williams, "Diameter Control of Ti-Catalyzed Silicon Nanowires," *J. Cryst. Growth*, 267, pp. 613-18 (2004).

X. Duan, Y. Huang, R. Agarwal and C. M. Lieber, "Single-nanowire electrically driven lasers," *Nature*, vol. 421, pp. 241-245, Jan. 16, 2003.

J. S. Lee, M. S. Islam and S. Kim, "Photoresponses of ZnO nanobridge devices fabricated using a single-step thermal evaporation method," *Sens. Actuators B: Chem* (2006), doi:10.1016/j.snb.2006.10.042.

A. B. Greytak, C. J. Barrelet, Y. Li and C. M. Lieber, "Semiconductor nanowire laser and nanowire waveguide electro-optic modulators," *Applied Physics Letters*, vol. 87, 151103, (2005).

P. J. Pauzauskie, D. J. Sirbuly and P. Yang, "Semiconductor Nanowire Ring Resonator Laser," *Physical Review Letters*, PRL 96, 143903 (2006).

HPDC, "Nanowire-based Opto-electronic Devices", Internat'l Search Report for PCT/US2008/005399, filed Apr. 25, 2008. Report issued by Korean Intellectual Property Office, Mar. 31, 2009.

NANOWIRE-BASED OPTO-ELECTRONIC DEVICE

BACKGROUND

Nanotechnology and quantum information technology involve the design of extremely small electronic and optical circuits that are built at the molecular level. In contrast to traditional opto-electronic circuits, which are formed by "top-down" fabrication techniques, nanotechnology utilizes "bottom-up" techniques, to build devices upwardly by adding material. For example, nanowires can be used to carry electrical and optical signals. Quantum information technology can utilize light particles, or photons, to convey information. It would be desirable to provide nanometer-scaled, opto-electronic devices that include nanowires for quantum information technology applications, where such devices can be fabricated by low-cost fabrication techniques in a manufacturing environment.

SUMMARY

An exemplary embodiment of a nanowire-based opto-electronic device comprises at least one first surface of a single crystal or non-single crystal material; at least one second surface of a single crystal or non-single crystal material, each second surface being electrically isolated from a respective first surface; and at least one first nanowire connecting at least one opposing first pair of the first and second surfaces in a bridging configuration, wherein the first nanowire is grown from the first and second surfaces, and interconnects between the first and second surfaces, of the first pair of the first and second surfaces.

An exemplary embodiment of a gain-clamped semiconductor optical amplifier comprises at least one first surface; at least one second surface, each second surface facing and electrically isolated from a respective first surface; a plurality of nanowires connecting each opposing pair of the first and second surfaces in a bridging configuration; and a signal waveguide overlapping the nanowires such that an optical signal traveling along the signal waveguide is amplified by energy provided by electrical excitation of the nanowires.

Another exemplary embodiment of a nanowire-based opto-electronic device comprises a first horizontal surface; a second horizontal surface electrically isolated from and facing the first horizontal surface; at least one vertical nanowire connecting the first and second horizontal surfaces in a bridging configuration, wherein the vertical nanowire (i) is grown from one of the first and second horizontal surfaces or (ii) is grown from, and interconnects between, the first and second horizontal surfaces; a first vertical surface; a second vertical surface electrically isolated from and facing the first vertical surface; and at least one horizontal nanowire connecting the first and second vertical surfaces in a bridging configuration, wherein the horizontal nanowire (i) is grown from one of the first and second vertical surfaces or (ii) is grown from, and interconnects between, the first and second vertical surfaces; wherein the horizontal nanowires and vertical nanowires are selectively electrically excitable to provide horizontal and vertical polarization, respectively.

DRAWINGS

DETAILED DESCRIPTION

Nanowire-based opto-electronic devices including lasers, photodetectors and semiconductor optical amplifiers (SOAs) are disclosed. Polarization-dependent lasers and polarization-sensing photodetectors are also disclosed. Exemplary embodiments of the lasers can be operated to emit light over a broad range of about 300 nm to more than 1500 nm.

Figure 1:
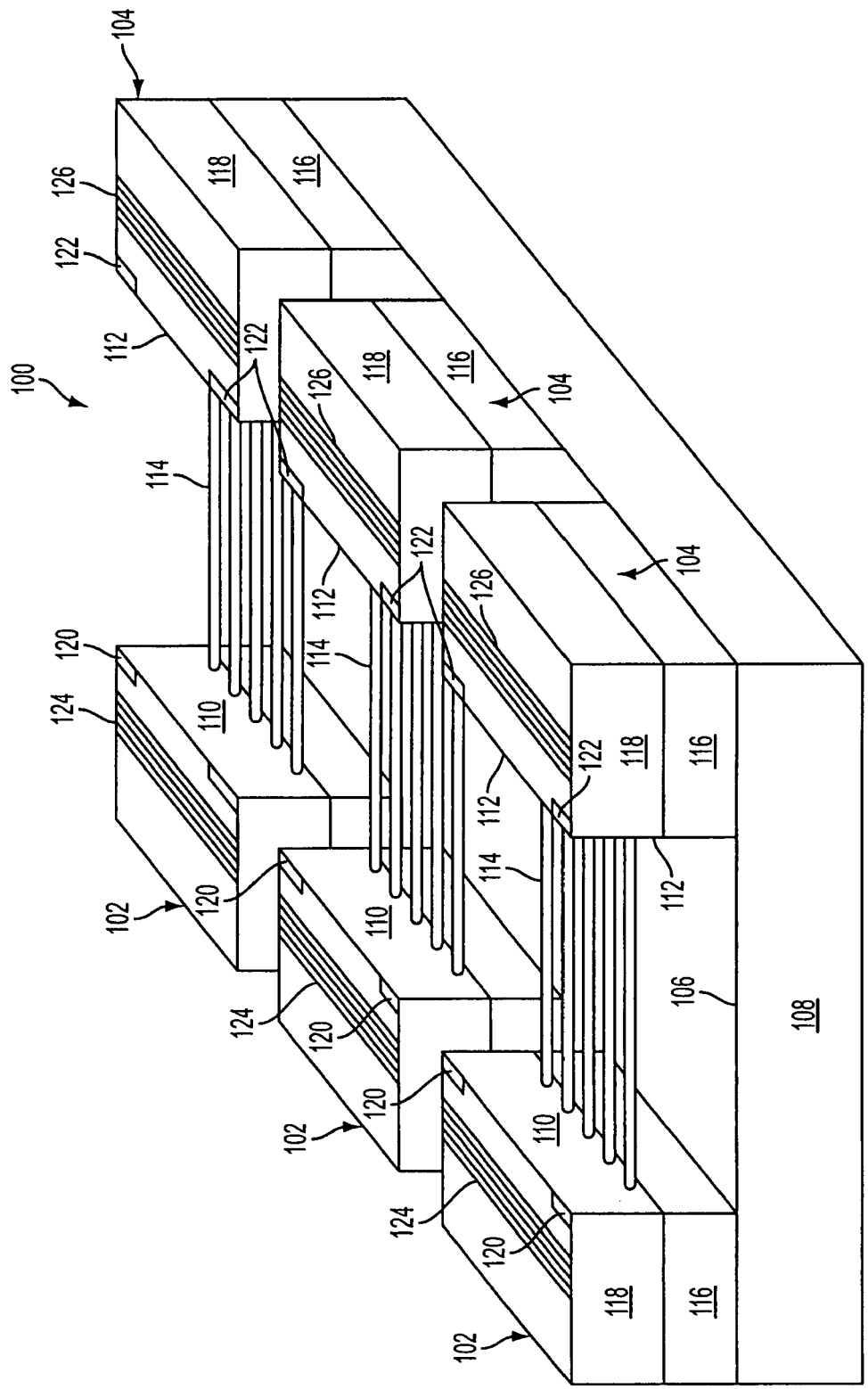
FIG. 1 illustrates an exemplary embodiment of a nanowire laser including nanowires connecting opposing surfaces in a bridging configuration.

An electrically-driven nanowire laser 100 according to an exemplary embodiment is shown in FIG. 1. The nanowire laser 100 comprises first protrusions 102 and opposing second protrusions 104 disposed on a surface 106 of a substrate 108. The first protrusions 102 each include a first surface 110 and the second protrusions 104 each include a second surface 112 facing a respective one of the first surfaces 110. In the embodiment, the first surfaces 110 and second surfaces 112 are vertical surfaces, which can be parallel to each other. One or more nanowires 114 (e.g., an array of nanowires) extends horizontally between opposing pairs of the first protrusions 102 and second protrusions 104 and connect the first surfaces 110 and second surfaces 112 in a bridging configuration. In this embodiment, the individual nanowires 114 are grown from one of the first surfaces 110 and second surfaces 112 and extend continuously between the opposed first surfaces 110 and second surfaces 112. The illustrated nanowire laser 100 comprises three pairs of first protrusions 102 and second protrusions 104. In other embodiments, the nanowire laser 100 can comprise less than three or more than three pairs of first protrusions 102 and second protrusions 104, such as ten to several hundred or more.

As shown in FIG. 1, the first protrusions 102 comprise a first layer 116 grown on the surface 106 of substrate 108, and a second layer 118 grown on the first layer 116. The second protrusions 104 include a first layer 116 grown on the surface 106 of the substrate 108, and a second layer 118 grown on the first layer 116.

In the embodiment, the substrate 106 can comprise a single crystal material or a non-single crystal material. The single crystal material can be single crystal silicon, e.g., a silicon wafer. The non-single crystal material can be an electrical conductor; microcrystalline or amorphous silicon; or an insulator, such as glass, quartz, a polymer (e.g., a thermoplastic, such as polyethylene terephthalate (PET)), a metal (e.g., a stainless steel, aluminum or an aluminum alloy), or combinations of these or other materials. These exemplary non-single crystal materials can reduce costs of manufacturing the nanowire laser 100. In some embodiments, the non-single crystal material can be provided on a roll, allowing multiple nanowire lasers to be fabricated using a roll manufacturing process.

The first layers 116 of the nanowire laser 100 comprise an insulating material, such as an oxide (e.g., $SiO_2$) or a nitride. For example, $SiO_2$ can be grown on a silicon substrate (e.g., (111) silicon). In another embodiment, a group III-V material that acts as an insulating layer, such as undoped AlAs or InAs, can be grown on a GaAs substrate. In another embodiment, similar lattice matched semiconductor materials can be grown on an InP substrate. For example, a semi-insulating $In_xAl_{1-x}As$ layer (i.e., first layer) can be grown on a doped InP wafer (i.e., substrate), followed by growing another doped InP layer (i.e., second layer) on the semi-insulating layer. All of such layers are lattice matched.

In the embodiment, the first layers 116 electrically isolate the first protrusions 102 from each other, the second protrusions 104 from each other, and the first protrusions 102 from the second protrusions 104.

The second layers 118 of the first protrusions 102 and second protrusions 104 can comprise single crystal material or non-single crystal material. In some embodiments, the material of the second layers 118 is lattice matched to the material of the respective first layers 116. In another embodiment, the second layers 118 can comprise more than one material, such as more than one single crystal material, more than one non-single crystal material, or a combination of at least one single crystal material and at least one non-single crystal material. In an embodiment, the first surfaces 110 and second surfaces 112 of the second layers 118 can comprise single crystal material (e.g., single crystal silicon) formed on a non-single crystal material (e.g., poly-crystalline, microcrystalline or amorphous silicon).

Suitable single crystal materials for forming the second layers 118 of the nanowire laser 100 include, e.g., Si, Ge; group IV compound semiconductors, e.g., SiC and SiGe; group III-V compound semiconductors, such as binary alloys, e.g., gallium phosphide (GaP), gallium arsenide (GaAs), indium phosphide (InP), indium nitride (InN), indium arsenide (InAs), aluminum arsenide (AlAs), aluminum nitride (AlN), boron nitride (BN) and boron arsenide (BAs); group II-VI semiconductors, such as zinc oxide (ZnO) and indium oxide (InO), and combinations of these or other semiconductor materials. For example, an epitaxial layer of Si can be fabricated on $SiO_2$ first layers using methods to produce SOI (silicon on insulator) layers. In another embodiment, a group III-V semiconductor material, such as GaAs, can be grown on a material that will act as an insulating layer, such as undoped AlAs or InAs.

In another embodiment, non-crystalline material, such as micro-crystalline or amorphous silicon can be deposited on either crystalline or other non-crystalline materials, such as metals, dielectrics or non-crystalline semiconductors. Nanowires can also be grown from these surfaces.

In embodiments of the nanowire laser 100 comprising first surfaces 110 and second surfaces 112 of single crystal or non-single crystal material, the single crystal or non-single crystal material can be any material that has suitable physical characteristics to enable the growth of nanowires from the first surfaces 110 and/or second surfaces 112. The non-single crystal material can be, e.g., polycrystalline silicon, amorphous silicon, microcrystalline silicon, sapphire, or carbon-based inorganic materials, such as diamond and diamond-like carbon. These non-single crystal materials can reduce costs of manufacturing the nanowire lasers, as compared to using more-expensive single crystal materials or compound semiconductor materials. Furthermore, single-crystal nanowires grown from non-single crystal surfaces can exhibit all of the properties of single crystalline semiconductor materials.

In an embodiment, the first layer(s) 116 and the second layer(s) 118 can both be epitaxially grown using any suitable techniques, such as molecular beam epitaxy (MBE), metalorganic chemical vapor deposition (MOCVD) and CVD.

The structure shown in FIG. 1 comprising separated first layers 116 and second layers 118 can be formed by patterning the as-grown second layer material using an overlying masking layer to form the opposing second layers 118 separated by a gap. The insulator material of the underlying first layer is patterned by removing a portion of the insulator material through an opening formed in the second layer material to expose the surface 106 of the substrate 108 and form opposing first layers 116 separated by a gap. For example, one or more of a lithographic technique, a dry etching technique (e.g., RIE) or a wet chemical etching technique can be used, to etch the first layer material and second layer material. For example, potassium hydroxide (KOH) is a wet chemical etchant that can be used to etch silicon anisotropically; $SiO_2$ can wet chemically etched with hydrofluoric acid (HF), anisotropically dry chemically etched using reactive ion etching, or anisotropically etched by ion milling; and GaAs can be wet chemically etched with $H_2SO_4$.

The second layers 118 of the first protrusions 102 and second protrusions 104 can have any suitable dimensions to provide sufficient surface area for nanowire growth. For example, the second surfaces 112 can typically have a height of about 10 nm to about 5000 nm, and a width of about 100 nm to about 10,000 nm. The first surfaces 110 and second surfaces 112 can be separated from each other by a distance of about 10 nm to about 10 μm, for example.

In the embodiment, the nanowire laser 100 comprises an electrical pump to pump the laser cavities formed by the nanowire arrays and Bragg mirrors associated with each pair of first protrusions 102 and second protrusions 104 with an electrical current or pulse. For example, the second layers 118 of the first protrusions 102 and second protrusions 104 can include highly-doped electrode regions 120, 122, respectively, adjacent ends of the nanowires, which contain a sufficient amount of p-type or n-type dopant to achieve a desired amount of electrical conductivity for making electrical contact. The electrode regions 120 of the first protrusions 102 can be doped p-type and the electrode regions 122 of the second protrusions 104 can be doped n-type, or vice versa. In other embodiments, electrodes (or contact pads) can be formed on the top surfaces of the respective second layers 118. The electrode regions 120, 122 (or electrodes) are electrically isolated from each other by the first layers 116. The electrode regions 120, 122 (or electrodes) can be electrically connected to a power source operable to inject carriers into the arrays of nanowires 114 to produce light emission from the nanowires. In the embodiment, the light emission is horizontally polarized.

In the embodiment, the nanowire laser 100 comprises a Bragg mirror located in or on each of the first protrusions 102 and second protrusions 104, respectively, to define opposite ends of optical cavities. For example, Bragg mirrors 124, 126 can be formed in or on each of the second layers 118 of the first protrusions 102 and second protrusions 104, respectively, as depicted in FIG. 1. Each set of Bragg mirrors 124, 126 defines opposite ends of a nanowire optical cavity. In some embodiments, the Bragg mirrors 124, 126 can comprise alternating Bragg reflector layers and air gaps located in the second layers 118. In other embodiments, the Bragg mirrors 124, 126 can comprise alternating layers of semiconductor materials having different indices of refraction from each other and/or from semiconductor material of the respective second layers, into which the Bragg mirrors are integrated. The Bragg mirrors can comprise alternating layers of semiconductor material including, e.g., the group IV, group III-V and group II-VI semiconductor materials, or another semiconductor material. The materials forming the layers of the Bragg mirrors 124, 126 can be lattice matched, and can be doped p-type or n-type to facilitate current biasing of the nanowires 114. Techniques for forming reflector layers of a Bragg mirror in a semiconductor structure are described in U.S. Patent Application Publication No. 2006/0098705, which is incorporated herein by reference in its entirety.

The Bragg mirror at one end of the nanowires 114 has a higher reflectivity than the Bragg mirror at the opposite end of the nanowires 114. For example, the Bragg mirror 124 at the first protrusions 102 can have at least one more period than the Bragg mirror 126 at the second protrusions 104, thereby increasing the probability that a generated photon will exit the optical cavity from the end of the nanowires 114 at the second protrusions 104. The second layers 118 of the first protrusions 102 and second protrusions 104 are transparent at the frequency of the photon. The Bragg mirrors 124, 126 facilitate amplification of optical signals generated in the nanowires 114.

In the nanowire laser 100 shown in FIG. 1, the nanowires 114 can be grown from either one of the first surfaces 110 and second surfaces 112 of the respective first protrusions 102 and second protrusions 104. For example, the nanowires 114 can be grown from the first surfaces 110 so that the nanowires 114 extend continuously between the first surfaces 110 and second surfaces 112, and impinge on, and mechanically and electrically connect to, the second surfaces 112 to directly bridge the first protrusions 102 and second protrusions 104. The ends of the individual nanowires 114 form a self-assembled nanowire connection between the opposing first surfaces 110 and second surfaces 112.

Figure 2:
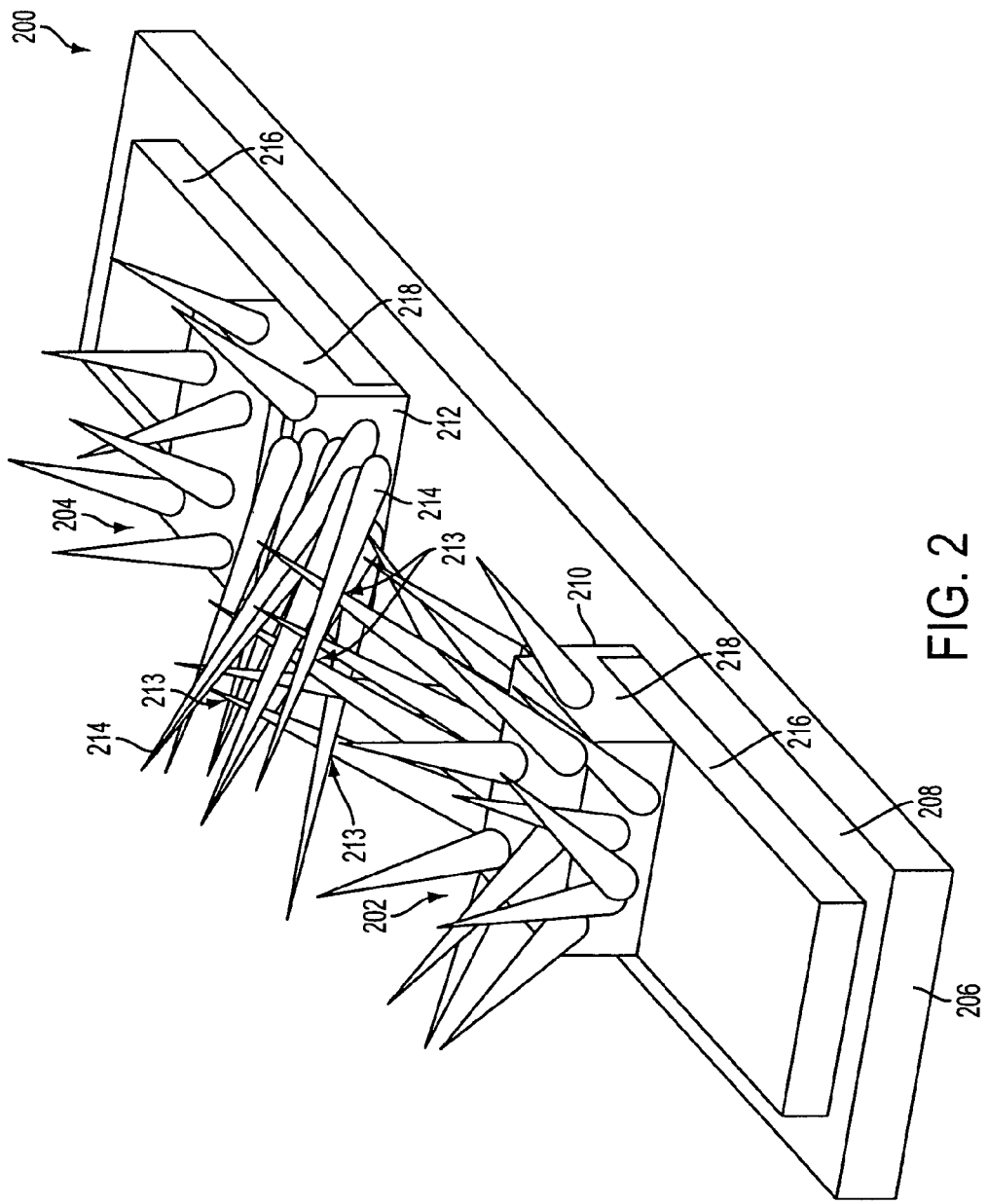
FIG. 2 illustrates an exemplary embodiment of a nanowire photodetector including nanowires connecting opposing surfaces in a bridging configuration in which the nanowires interconnect between the surfaces.

FIG. 2 depicts an electrically-driven nanowire photodetector 200 according to another exemplary embodiment. The nanowire photodetector 200 comprises a first protrusion 202 and an opposing second protrusion 204 disposed on a surface 206 of a substrate 208. The first protrusion 202 includes a first surface 210 and the second protrusion 204 includes a second surface 212 facing the first surface 210. In the embodiment, the first surface 210 and second surface 212 are vertical surfaces. In some other embodiments, the first surface 210 and second surface 212 can be horizontal surfaces. The vertical or horizontal surfaces can be parallel to each other, as shown. In the embodiment, the first surface 210 and second surface 212 face each other. In some other exemplary embodiments, the first surface 210 and second surface 212 do not face other. One or more nanowires 214 (e.g., a plurality of nanowires 214 as shown) extends between the first protrusion 202 and second protrusion 204 and connect the first surfaces 210 and second surfaces 212 in a bridging configuration. In this embodiment, the individual nanowires 214 are grown from the first surface 210 and from the second surface 212 and interconnect ("fuse") between the first surface 210 and second surface 212, such that the ends of the interconnecting nanowires 214 provide electrical contact to allow electrical carriers to be manipulated in the nanowires 214. Exemplary joints 213 formed between interconnected nanowires 214 are shown. Such joints can formed along the lengths of the nanowires 214 and/or at the ends opposite the growth surfaces of the nanowires 214. The nanowires 214 are randomly oriented. Multiple nanowires 214 can fuse together.

In the nanowire photodetector 200, the substrate 208 comprises an electrical insulator, such as $SiO_2$. The substrate 208 can be grown on silicon, e.g., a silicon wafer. The first protrusion 202 includes a first layer 216 and the second protrusion 204 includes a first layer 216. The first layers 216 are electrodes. The first layers 216 can comprise, e.g., a Pt/Ti film structure. The Ti film provides adhesion and the Pt film allows silicide formation. The Pt/Ti film structure can be deposited on the $SiO_2$ surface 206 by vacuum thermal evaporation at ambient temperature, for example. The Ti and Pt films are patterned to form the electrodes. The first protrusion 202 also includes a second layer 218 and the second protrusion 204 includes a second layer 218. The second layers 218 comprise at least one semiconductor material, e.g., n-type hydrogenated microcrystalline silicon, which can be deposited, e.g., by plasma enhanced chemical vapor deposition (PECVD) onto the patterned first layers 216. The second layers 218 are electrically isolated by the substrate 208.

The illustrated nanowire photodetector 200 comprises one first protrusion 202 and second protrusion 204. In other embodiments, the nanowire photodetector 200 can comprise more than one pair of first protrusions 202 and second protrusions 204, such as tens, hundreds or thousands. In such embodiments, each array of nanowires 214 can detect light of the same wavelength, or at least one array of nanowires 214 can detect light of a different wavelength than the other arrays. For example, such at least one array can comprise nanowires 214 having a different composition from the nanowires of the other arrays.

Some embodiments of the nanowire-based opto-electronic devices can comprise a combination of at least one continuously grown nanowire (such as a nanowire 114 shown in FIG. 1 and optionally also including associated Bragg mirrors) and at least one interconnecting nanowire (such as a nanowire 114 shown in FIG. 2). Such embodiments can provide more than one function, such as photodetection and light emission.

The nanowires 114, 214 of the nanowire laser 100 and nanowire photodetector 200 can comprise at least one compound semiconductor material. Certain compound semiconductor materials have a direct bandgap and can convert electrical energy to light energy efficiently. To reduce lattice matching problems (and "anti-phase domain boundary" problems for some materials), nanowires 114, 214 comprising such compound semiconductor materials are grown over very small areas of a surface of another single crystal or non-single crystal material. In exemplary embodiments, nanowires 114, 214 comprising a compound semiconductor material can be grown on an elemental semiconductor material, e.g., silicon; nanowires 114, 214 comprising one compound semiconductor material can be grown on another lattice mismatched compound semiconductor material; or nanowires 114, 214 of a compound semiconductor material can be grown on a non-single crystal material surface, e.g., polysilicon.

Exemplary compound semiconductor materials that can be used to form the nanowires 114, 214 of the nanowire laser 100 and nanowire photodetector 200 include at least one Group III-V material, such as at least one binary alloy selected from GaP, GaAs, InP, InN and the like; at least one higher Group III-V alloy, such as AlGaAs, InAsP, GaInAs, GaAlAs, GaPAs, and the like; or combinations of these or other compound semiconductor materials. For example, a GaAs nanowire will grow substantially normal to a (111) plane of a crystal lattice, such as a surface of GaAs or Si. The nanowires 114, 214 can also comprise ZnO or InO.

Exemplary techniques for growing compound semiconductor materials are described by B. J. Ohlsson, M. T. Bjork, M. H. Magnusson, K. Deppert and L. Samuelson, *Size-, shape-, and position-controlled GaAs nano-whiskers*, Appl. Phys. Lett., vol. 79, no. 20, pp. 3335-3337 (2001) (growth of GaAs nano-whiskers on GaAs substrates by metal-catalyzed growth techniques); M. H. Huang, S. Mao, H. Feick, H. Yan, Y. Wu, H. Kind, E. Weber, R. Russo and P. Yang, *Room-Temperature Ultraviolet Nanowire Nanolasers*, Science, vol. 292, pp. 1897-1899 (2001) (growth of ZnO nanowires on sapphire substrates); S. S. Yi, G. Girolami, J. Adamo, M. Saif Islam, S. Sharma, T. I. Kamins and I. Kimukin, *InP nanobridges epitaxially formed between two vertical Si surfaces by metal-catalyzed chemical vapor deposition, Appl. Phys. Lett.*, vol. 89, 133121 (2006) (epitaxial growth of InP nanowires on silicon surfaces); and Haoquan Yan, Rongrui He, Justin Johnson, Matthew Law, Richard J. Saykally and Peidong Yang, *Dendritic Nanowire Ultraviolet Laser Array, J. Am. Chem. Soc.*, vol. 125, no. 16, 4729 (2003) (fabrication of dendritic nanowire arrays of ZnO), each of which is incorporated herein by reference in its entirety.

Other exemplary embodiments of the nanowire laser 100 and nanowire photodetector 200 can comprise nanowires 114, 214 including at least one controlled boundary at a given location along the nanowires formed during growth to control electronic properties of the nanowire. The nanowires 114, 214 can include a p-region and an n-region defining a p-n junction along the nanowires to assist in forming a strong built-in field in the nanowires. For example, the nanowires 114, 214 can include a p-region adjacent p-doped regions formed in the second layers 118, 218 of the first protrusions 102, 202, and an n-region adjacent n-doped regions formed in the second layers 118, 218 of the second protrusions 104, 204.

Nanowire heterostructures can be formed by sequentially depositing different semiconductor materials along the nanowires 114, 214. Heteroepitaxial layers having different compositions can be formed between p-regions and n-regions of the nanowires. See, e.g., M. T. Bjork, B. J. Ohlsson, T. Sass, A. I. Persson, C. Thelander, M. H. Magnusson, K. Deppert, L. R. Wallenberg and L. Samuelson, *One-dimensional Steeplechase for Electrons Realized, Nano Lett.*, vol. 2, no. 2, pp. 87-89 (2002) (forming InAs whiskers containing segments of InP), which is incorporated herein by reference in its entirety. In another exemplary embodiment, InGaAs is formed between InP, which has a relatively higher bandgap. If the deposition of both semiconductor materials is catalyzed by metal nanoparticles, segments of different materials can be sequentially grown along the nanowires, thereby forming heterojunctions between the adjacent segments. For example, multiple quantum well structures can be formed in the nanowires to produce sufficient lasing action at relatively low threshold currents. Exemplary multiple quantum well structures include InAlGaAs on InP, InGaAsP on InP and GaAsSb on GaAs.

In some embodiments, an active region comprising a quantum dot (QD) can be grown into the nanowires 114, 214 during their growth. The quantum dot comprises a material having a different band gap than the material of the growing nanowire. The quantum dot can be electrically excited by electrical current to emit a single photon, which travels along the nanowire and is reflected by the Bragg mirrors defining the optical cavity. For example, a quantum dot can be formed by introducing (i.e., growing) a small amount of InGaAs at a desired point of a growing InP nanowire. InGaAs has a low bandgap relative to InP. Then, the growth InP nanowire is resumed. See, e.g., U.S. Patent Application Publication Nos. 2006/0280414 and 2006/0098705, each of which is incorporated herein by reference in its entirety.

The nanowires 114, 214 can be formed using any suitable growth technique. Suitable methods of growing the nanowires are described, e.g., in U.S. Patent Application Publication No. 2006/0097389, which is incorporated herein by reference in its entirety. For example, the nanowires can be grown from single crystal or non-single crystal surfaces by chemical vapor deposition (CVD) techniques. Nanobridge formation using catalyst growth techniques are described, e.g., by T. Kamins, *Beyond CMOS Electronics: Self-Assembled Nanostructures, The Electrochemical Society Interface*, Spring 2005; and M. Saif Islam, S. Sharma, T. I. Kamins and R. Stanley Williams, *Ultrahigh-Density Silicon Nanobridges Formed Between Two Vertical Silicon Surfaces, Nanotechnology* 15, L5-L8 (2004), each of which is incorporated herein by reference in its entirety. In these techniques, nanowires are grown by interaction of a depositing material with a catalyst nanoparticle formed on the surface from which the nanowires are grown. Nanoparticles can be formed directly on the growth surface, or the catalyst material can be deposited (e.g., by physical vapor deposition (PVD) or chemical vapor deposition (CVD)) on the growth surface followed by annealing the catalyst material to form the nanoparticle catalyst. Metal catalyst nanoparticles can comprise, for example, Ti, Au, Fe, Co, Ga and alloys thereof. The metal can be selected based on the nanowire composition. The catalyst nanoparticles can be in the liquid or solid phase during nanowire growth.

The nanoparticle catalyst or catalyst material can be deposited preferentially on selected surfaces and/or surface regions at which nanowire growth is desired. Angled deposition of the nanoparticle catalyst or catalyst material can be employed to preferentially deposit the nanoparticle catalyst or catalyst material, to allow control of the starting location for growth of the nanowires on a surface.

The gas composition that is used to form the nanowires depends on the desired nanowire composition. In some embodiments, the surface from which the nanowires are grown is exposed to the gas in a reactor chamber of a deposition system. The process chamber conditions and the process gas are controlled during nanowire growth. The process gas can be a single gas or a gas mixture. P-type and n-type dopants can be added from the gas phase during nanowire growth.

The nanowires 114, 214 can be formed with a substantially constant diameter along their length. The nanowires can typically have a diameter of about 10 nm to about 100 nm.

In another embodiment of the nanowire laser or nanowire photodetector (not shown), the first protrusions and second protrusions can comprise the same single crystal material or non-single crystal material as the substrate. In other words, the substrate and first and second protrusions can comprise a single piece of bulk material and the protrusions do not include first and second layers as in the nanowire laser 100 and nanowire photodetector 200. In the embodiment, the single crystal material can be a silicon wafer, for example. For example, as described in U.S. Patent Application Publication No. 2005/0133476, which is incorporated herein by reference in its entirety, a silicon substrate can be etched to form longitudinally-extending walls including opposing spaced vertical surfaces, which are parallel (111) lattice planes separated by a gap. Nanowires can be grown from at least one of the vertical surfaces across the gap to connect opposite vertical surfaces to form nanowire bridges. The vertical surfaces can be surfaces of p-type and n-type electrodes, such that the nanowires can be electrically driven to generate light.

In the embodiment, the non-single crystal material can be selected from polycrystalline silicon, amorphous silicon, microcrystalline silicon, sapphire, or carbon-based inorganic materials, such as diamond and diamond-like carbon. In the embodiment, the first protrusion and second protrusion can include p-type and n-type electrode regions, and are electrically isolated from each other. An electrical insulator region can be formed in the substrate to electrically separate the p-type and n-type material to enable electrical current to flow through the nanowires without having electrical shortage within the substrate.

Operation of the nanowire laser 100 depicted in FIG. 1 will be described. It will be understood that the nanowire photodetector 200 depicted in FIG. 2 can be operated in a similar manner. During operation of the nanowire laser 100, an electrical current or pulse is applied to the electrode regions 120, 122 to inject carriers to electrically pump the optical cavities comprising the arrays of nanowires 114. In an embodiment, the optical cavities can be pumped simultaneously. In another embodiment, the nanowire laser 100 can comprise electrical circuitry formed in the substrate 108 to allow each nanowire array to be individually electrically excited, to allow the arrays of nanowires 114 to emit light in a selected temporal sequence. Generated photons travel along the lengths of nanowires 114 and are reflected at opposite ends of the optical cavities by the Bragg mirrors 124, 126. Light exits the end of the optical cavities at which the Bragg mirror having a relatively lower reflectivity is located. An optional photodetector (not shown) can be arranged to detect light that exits the optical cavities to monitor operation of the device (e.g., on/off state and light leakage).

In an embodiment, each array of nanowires 114 emits light of the same wavelength. In another embodiment, at least one array of nanowires 114 can emit light of a different wavelength than the other arrays. For example, at least one array can comprise nanowires 114 having a different composition from the nanowires of the other arrays. For example, a first array of nanowires 114 that emits at a first wavelength and a second array of nanowires 114 that emits at a second wavelength can be formed in an alternating arrangement along the length of the nanowire laser 100.

Figure 3:
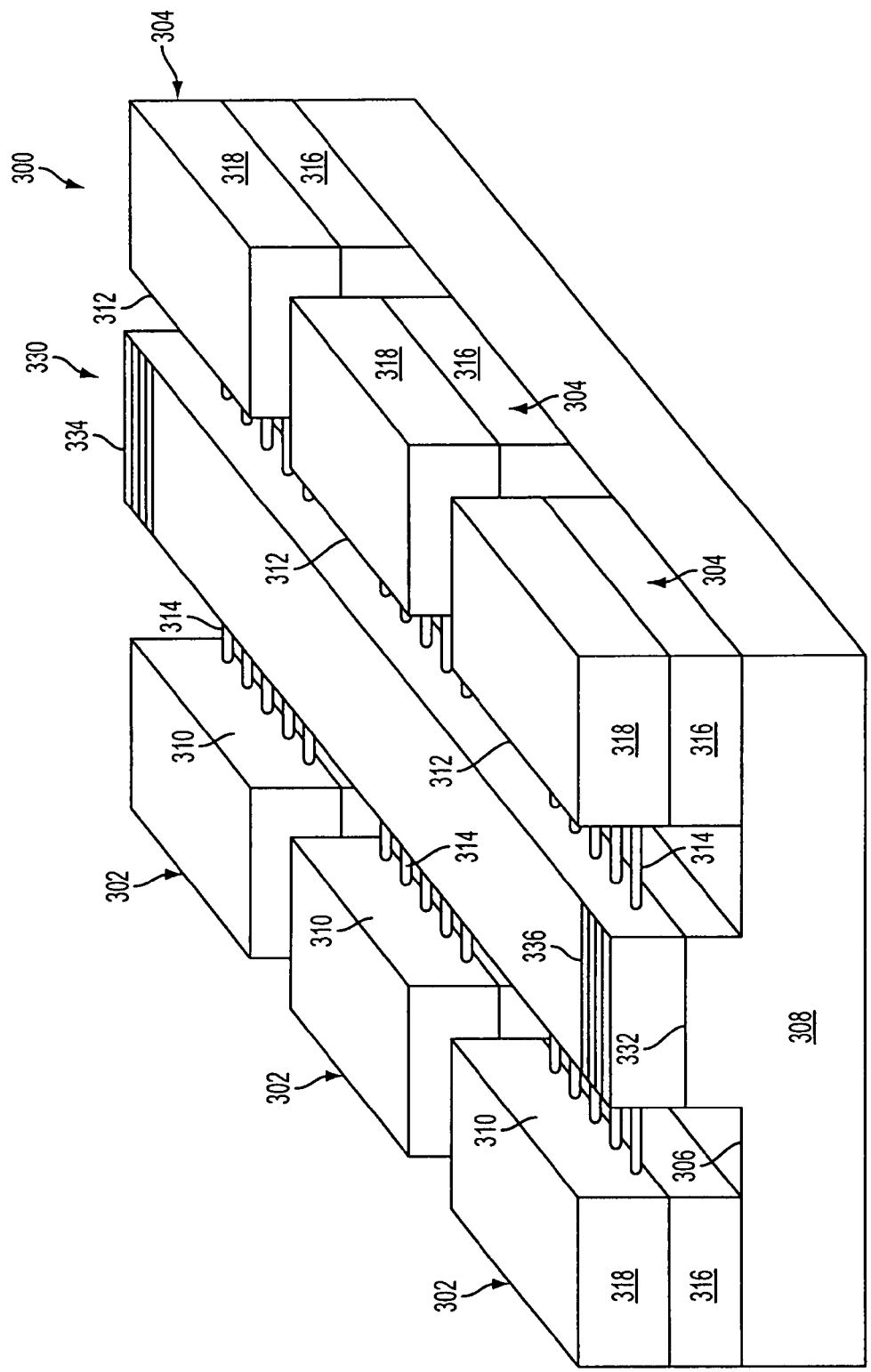
FIG. 3 illustrates an exemplary embodiment of a nanowire-based semiconductor optical amplifier.

FIG. 3 illustrates an exemplary embodiment of a nanowire-based semiconductor optical amplifier (SOA) 300. As shown, the semiconductor optical amplifier 300 comprises longitudinally-spaced first protrusions 302 and opposing longitudinally-spaced second protrusions 304 disposed on a surface 306 of a substrate 308. The first protrusions 302 each include a first surface 310 and the second protrusions 304 each include a second surface 312 facing a respective one of the first surfaces 310. The illustrated first surfaces 310 and second surfaces 312 are parallel, vertical surfaces. Arrays of nanowires 314 extend horizontally between the opposing pairs of the first protrusions 302 and second protrusions 304 and connected the first surfaces 310 and second surfaces 312 in a bridging configuration. A signal waveguide 330 for guiding an optical signal along a signal path is disposed between the first surfaces 310 and second surfaces 312. As shown, the signal waveguide 330 overlaps the longitudinally-spaced arrays of nanowires 314. The signal waveguide 330 is formed on a longitudinally-extending raised surface 332 of the substrate 308 and extends horizontally, substantially parallel to the first surfaces 310 and second surfaces 312. Bragg mirrors 334, 336 are provided on opposite ends of the signal waveguide 330.

The illustrated semiconductor optical amplifier 300 comprises three pairs of first protrusions 302 and second protrusions 304 and corresponding arrays of nanowires 314. In other embodiments, the semiconductor optical amplifier 300 can comprise less than three or more than three pairs of first protrusions 302 and second protrusions 304, such as ten to several hundred or more.

As shown in FIG. 3, the first protrusions 302 include a first layer 316 grown on the surface 306 of the substrate 308, and a second layer 318 grown on the first layer 316. The second protrusions 304 include a first layer 316 grown on the surface 306 of the substrate 308, and a second layer 318 grown on the first layer 316. The substrate 308 can comprise a single crystal material or a non-single crystal material. The first layer 316 of the first protrusions 302 and second protrusions 304 comprises an insulator material. In the embodiment, the first layers 316 electrically isolate the first protrusions 302 from each other, the second protrusions 304 from each other, and the first protrusions 302 from the second protrusions 304. The substrate 308 and first layers 316 can be made from selected materials described above with regard to the nanowire lasers 100, 200. The arrays of nanowires 314 can be functionally isolated from each other by the first layers 316 so that the arrays can be provided with distinct electrical pump currents.

In the embodiment, the second layer 318 of the first protrusions 302 and second protrusions 304 can comprise single crystal materials or non-single crystal materials. In some embodiments, the material of the second layers 318 is lattice matched to the material of the respective first layers 316. The second layers 318 can comprise more than one material, such as more than one single crystal material, more than one non-single crystal material, or a combination of at least one single crystal material and at least one non-single crystal material. For example, the first surfaces 310 and second surfaces 312 of the second layers 318 can comprise single crystal material formed on a non-single crystal material.

Suitable single crystal materials for making the second layers 318 of the semiconductor optical amplifier 300 include, e.g., Si, Ge, SiC, SiGe, GaP, GaAs, InP, InN, InAs, AlAs, AlN, BN, BAs, ZnO, InO, and combinations of these or other semiconductor materials. Suitable non-single crystal material for the second layers 318 include, e.g., polycrystalline silicon, amorphous silicon, microcrystalline silicon, sapphire, or carbon-based inorganic materials, such as diamond and diamond-like carbon.

The nanowires 314 of the semiconductor optical amplifier 300 comprise at least one compound semiconductor material. Exemplary compound semiconductor materials that can be used to form the nanowires of the semiconductor optical amplifier 300 include, e.g., at least one Group III-V material, such as at least one binary alloy selected from GaP, GaAs, InP, InN and the like; at least one higher Group III-V alloy, such as AlGaAs, InAsP, GaInAs, GaAlAs, GaPAs and the like; ZnO, InO, or combinations of these or other compound semiconductor materials. The nanowires 314 can comprise heterojunctions, including quantum dots or multiple quantum wells, as described above.

In the embodiment, the signal waveguide 330 can be a polymer waveguide that can be photolithographically fabricated on the nanowires 314. The first protrusions 302 and second protrusions 304 are electrically isolated by a dielectric material, e.g., $SiO_2$, and the polymer waveguide having a refractive index higher than that of the dielectric material and air can be used to confine light. The signal waveguide 330 typically can have a rectangular shape with a length dimension of about one to ten times the light wavelength, and width and height dimensions of about 1 μm to about 10 μm.

The semiconductor optical amplifier 300 also comprises features for making electrical contact with opposite ends of the nanowires 314 so that an electrical current or pulse can be applied to the arrays of nanowires 314. For example, the second layers 318 of the first protrusions 302 and second protrusions 304 can include highly-doped p-type and n-type regions, or electrodes formed on or in the second layers 318, as described above.

During operation of the semiconductor optical amplifier 300, an optical signal traveling along the length of the signal waveguide 330 is amplified by energy generated by electrical excitation of the nanowires 314. The arrays of nanowires 314 function as ballast lasers and amplify the optical signal. The use of ballast lasers allows the semiconductor optical amplifier 300 to operate in the gain-clamped mode where the signal to be amplified has uniform gain and is not sensitive to prior bit patterns. The optical signal can be amplified using energy from lasing fields of one or more of the ballast lasers. The lasing cavities of the arrays of nanowires 314 are operated above threshold and the gain is clamped to overcome the losses of the cavities. That is, the laser cavities are excited by a bias current greater than a threshold current. Gain along the signal waveguide can be stabilized.

In an embodiment, each array of nanowires 314 emits light of the same wavelength. In another embodiment, at least one array of nanowires 314 can emit light of a different wavelength than the other arrays. For example, such at least one array can comprise nanowires 314 having a different composition from the nanowires of the other arrays. For example, a first array of nanowires 314 that emits at a first wavelength and a second array of nanowires 314 that emits at a second wavelength can be formed in an alternating arrangement along the length of the semiconductor optical amplifier 300.

Figure 4:
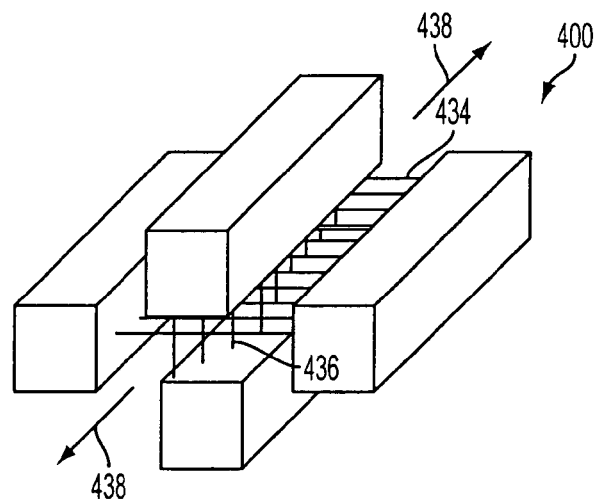
FIG. 4 illustrates a basic structure and principle of operation of another embodiment of a nanowire-based opto-electronic device.
Figure 5A:
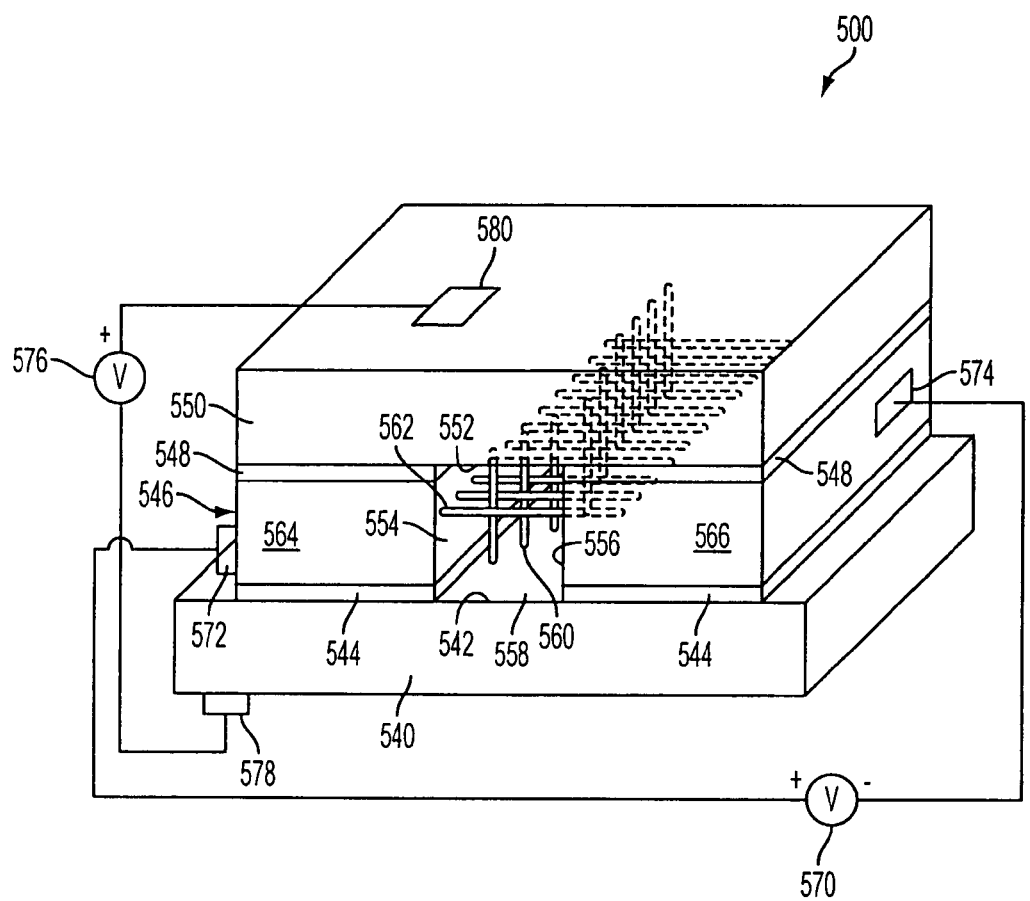
FIG. 5A is a perspective view of another exemplary embodiment of a nanowire-based opto-electronic device.
Figure 5B:
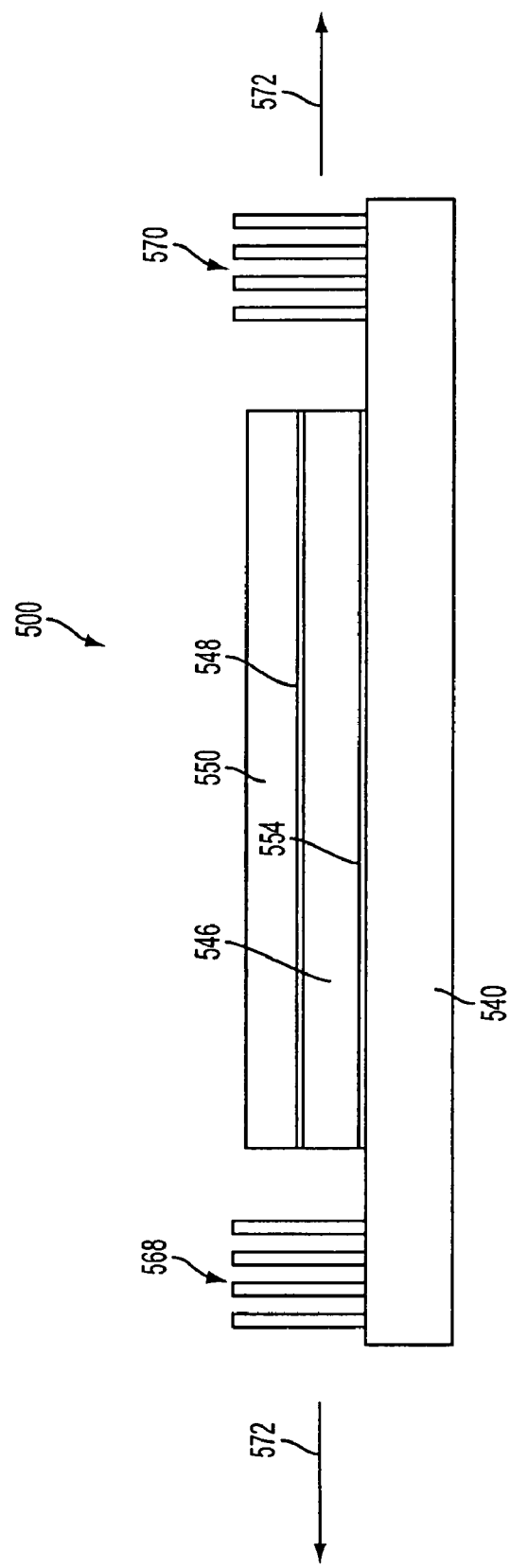
FIG. 5B is a side view of the nanowire-based opto-electronic device shown in FIG. 5A.

FIGS. 4, 5A and 5B illustrate another exemplary embodiment of a nanowire-based opto-electronic device. The exemplary opto-electronic device comprises polarization-dependent lasers and can be operated to generate light with unique polarization. Light has the ability to be polarized into various states. For example, linear polarization can be vertical or horizontal. The opto-electronic device is constructed to be able to selectively emit horizontally-polarized and vertically-polarized light. Pulses of horizontally or vertically polarized light, with one photon per pulse, can be emitted. For example, a single photon of horizontally-polarized light can encode one bit of information, such as a "0", and a single photon of vertically-polarized light can encode a "1". Thus, a single photon can represent a single quantum bit of information. The opto-electronic device can also be used as a nanowire-based photodetector to sense light polarization.

FIG. 4 illustrates a basic structure and the principle of operation of an embodiment of the opto-electronic device 400 including horizontal nanowires 434 and vertical nanowires 436. As shown, the nanowires 434, 436 are disposed along the length of the opto-electronic device 400. The direction of light emission is indicated by arrows 438.

FIGS. 5A and 5B depict an exemplary embodiment of the opto-electronic device 500. As shown, the opto-electronic device 500 comprises a substrate 540 having a first horizontal surface 542, a first insulator layer 544 formed on the first horizontal surface 542, a first semiconductor layer 546 formed on the first insulator layer 544, a second insulator layer 548 formed on the first semiconductor layer 546, and a second semiconductor layer 550 formed on the second insulator layer 548 and having a second horizontal surface 552 facing the first horizontal surface 542. The first insulator layer 544, first semiconductor layer 546 and second insulator layer 548 define a first vertical surface 554 and a second vertical surface 556 opposing the first vertical surface 554. The first horizontal surface 542, second horizontal surface 552, first vertical surface 554 and second vertical surface 556 define a cavity 558. The cavity 558 can have a length of about 1 µm to about 200 µm, and height and width dimensions of about 100 nm to about 10 µm, for example. The first horizontal surface 542 is electrically isolated from the second horizontal surface 552, and the first vertical surface 554 is electrically isolated from the second vertical surface 556, by the first insulator layer 544 and second insulator layer 548.

One or more vertical nanowires 560 (e.g., a plurality of vertical nanowires 560) connect the first horizontal surface 542 and second horizontal surface 552 in a bridging configuration. Bragg mirrors (not shown) are provided in the substrate 540 and second semiconductor layer 550 at or in the first horizontal surface 542 and second horizontal surface 552 to define a vertical optical cavity comprising the vertical nanowires 560. One or more horizontal nanowires 562 (e.g., a plurality of horizontal vertical nanowires 562) are connected to the second semiconductor layer region 564 at the first vertical surface 554 and to the second semiconductor layer region 566 at the second vertical surface 556 in a bridging configuration. Bragg mirrors (not shown) are provided at the first vertical surface 554 and second vertical surface 556 at the second semiconductor layer regions 564, 566 to define a horizontal optical cavity comprising the horizontal nanowires 562. The Bragg mirrors can have different reflectivity such that most of the light exits at one end and the other end has less light used, e.g., for monitoring the laser.

In the embodiment, the vertical nanowires 560 are grown from one of the first horizontal surface 542 and second horizontal surface 552, and the horizontal nanowires 562 are grown from one of the first vertical surface 554 and second vertical surface 556. In another embodiment (not shown), the vertical nanowires 560 are grown from, and interconnect between, the first horizontal surface 542 and the second horizontal surface 552, and the horizontal nanowires 562 are grown from, and interconnect between, the first vertical surface 554 and the second vertical surface 556, such as in the nanowire structure shown in FIG. 2.

As shown in FIG. 5B, Bragg mirrors 568, 570 are disposed at opposite ends of the cavity 558. Light is emitted from the cavity 558 in the direction 572.

The opto-electronic device 500 also comprises an electrical pump to pump the laser cavity formed by the horizontal nanowires 562 and Bragg mirrors integrated with the first vertical surface 554 and second vertical surface 556, and the laser cavity formed by the vertical nanowires 560 and the Bragg mirrors integrated with the first horizontal surface 542 and second horizontal surface 552, with an electrical current or pulse. For example, the substrate 540 can be highly n-doped in the region of the first horizontal surface 542, the second semiconductor layer 550 can be highly p-doped in the region of the second horizontal surface 552, the first semiconductor layer region 564 can be highly p-doped in the region of the first vertical surface 554, and the first semiconductor layer region 566 can be highly n-doped in the region of the second vertical surface 556. As shown, a power source 570 can be electrically connected to the first semiconductor layer regions 564, 566 via contact pads 572, 574, and another power source 576 can be electrically connected to the substrate 540 and second semiconductor layer 550 via contact pads 578, 580. For light emission, a forward bias is applied by the power sources 570, 576.

Various semiconductor materials can be used to form the substrate 540, first semiconductor layer 546 and second semiconductor layer 550. For example, the substrate 540, first semiconductor layer 546 and second semiconductor layer 550 can each comprise the same semiconductor material, such as silicon. For example, the substrate 540 can be a silicon wafer. In another embodiment, the first semiconductor layer 546 and second semiconductor layer 550 can comprise different semiconductor materials, such as at least one of the group III-V compound semiconductor materials described herein.

The vertical nanowires 560 and horizontal nanowires 562 of the opto-electronic device 500 comprise at least one semiconductor material. For photodetector (i.e., light detection) operation, the vertical nanowires 560 and horizontal nanowires 562 can comprise any suitable elemental or compound semiconductor material, such as Si, Ge or Si—Ge alloys, and compound semiconductor materials. Silicon nanowires can be grown in a CVD system using a mixture of silane ($SiH_4$) and HCl, or dichlorosilane ($SiH_2Cl_2$), using Au or Ti as the catalyst material, to nucleate the nanowires. Ge nanowires can be formed using Au-catalyzed, epitaxial growth on silicon substrates with a gas mixture of $GeH_4$ and $H_2$ at growth temperatures of about 320° C. to 380° C., as described by T. I. Kamins, X. Li and R. Stanley Williams, *Growth and Structure of Chemically Vapor Deposited Ge Nanowires on Substrates, Nano Letters*, Vol. 4, No. 3, pp. 503-06 (2004), which is incorporated herein by reference in its entirety.

For laser (i.e., light emission) operation, the vertical nanowires 560 and horizontal nanowires 562 can comprise one or more compound semiconductor materials, such as at least one Group III-V material, such as at least one binary alloy selected from GaP, GaAs, InP, InN and the like; at least one higher Group III-V alloy, such as AlGaAs, InAsP, GaInAs, GaAlAs, GaPAs and the like; ZnO, InO, or combinations of these or other compound semiconductor materials. The vertical nanowires 560 and horizontal nanowires 562 can comprise heterojunctions, including quantum dots or multiple quantum wells, as described above.

In embodiments of the opto-electronic device 500, features of the vertical nanowires 560 and horizontal nanowires 562, such as the number, spatial arrangement, and diameter of the nanowires can be selectively varied to control the characteristics of the emitted horizontally-polarized and vertically-polarized light. In an embodiment, each vertical nanowire 560 and horizontal nanowire 562 emits light of the same wavelength. In another embodiment, the vertical nanowires 560 can emit light of a different wavelength than the horizontal nanowires 562.

In an exemplary embodiment, the opto-electronic device 500 is fabricated by forming the first insulator layer 544 on the substrate 540, forming the first semiconductor layer 546 on the first insulator layer 544, and forming the second insulator layer 548 on the first semiconductor layer 546. Then, the second insulator layer 548 can be patterned to remove material from the second insulator layer 548, the first semiconductor layer 546 and the first insulator layer 544 to expose the first horizontal surface 542 of the substrate 540, and form the first vertical surface 554 and second vertical surface 556. The process preferably results in the first vertical surface 554 and second vertical surface 556 being parallel to each other. The as-formed opening in the second insulator layer 548, first semiconductor layer 546 and first insulator layer 544 is then filled with a dielectric material, for example. The second semiconductor layer 550 is formed on the second insulator layer 548 and dielectric material. The dielectric material is removed by etching to produce the cavity 558.

The vertical nanowires 560 and horizontal nanowires 562 are then grown in the cavity 558. Nanowires can be formed on selected ones of the first horizontal surface 542, second horizontal surface 552, first vertical surface 554 and second vertical surface 556. Nanowires can be formed wherever there are nanoparticles, such as Au nanoparticles, on a surface with crystal information. Nanowire formation on a surface can be prevented by applying a thin film of a dielectric material, such as silicon nitride or silicon dioxide, on the surface. Nanoparticles can be applied to each of the first horizontal surface 542, second horizontal surface 552, first vertical surface 554 and second vertical surface 556 using a liquid application technique in which nanoparticles, such as Au nanoparticles, are suspended in a colloidial system. After applying the nanoparticles to the selected surface(s) of the opto-electronic device 500, nanowires, such as group III-V compound semiconductor nanowires, are grown using a suitable technique, such as MOCVD. In the cavity 558, vertical and horizontal nanowires can be grown continuously from one surface (on which nanoparticles are applied) to an opposing surface, as depicted in FIG. 1, and/or from both opposing surfaces (on which nanoparticles are applied) to form interconnecting nanowires, as depicted in FIG. 2.

The Bragg mirrors 568, 570 can then be formed at opposite ends of the horizontal cavity 558.

During operation of the opto-electronic device 500 in the laser mode, the vertical nanowires 560 and horizontal nanowires 562 are selectively electrically excited to emit vertically polarized light and horizontally polarized light, respectively. In an embodiment, the vertical nanowires 560 and horizontal nanowires 562 can be simultaneously electrically excited to emit to a desired level. In another embodiment, the vertical nanowires 560 can be electrically excited to emit while the horizontal nanowires 562 are operated at a lower bias level sufficient for gain medium transparency, or vice versa. As described above, photons of the horizontally-polarized light emitted by the horizontal nanowires 562 can encode one bit of information, such as a "0", and a photon of the vertically-polarized light emitted by the vertical nanowires 560 can encode a "1", for example. The device can also provide on/off encoding to double the information bandwidth. In an embodiment, the polarizations can be switched instantly by selectively biasing the vertical nanowires 560 and horizontal nanowires 562 with more or less gain using appropriate electrical circuitry.

When the opto-electronic device 500 is operated as a photodetector, light will be absorbed differently by the vertical nanowires 560 and horizontal nanowires 562. In such embodiment, the nanowires are typically un-doped and the device is operated in the reverse bias mode. One or more vertical nanowires 560 can be grown from the first horizontal surface 542 or second horizontal surface 552, and one or more horizontal nanowires 562 can be grown from the first vertical surface 554 or second vertical surface 556, to extend continuously between the first horizontal surface 542 and second horizontal surface 552, and between the first vertical surface 554 and second vertical surface 556. Alternatively, one or more vertical nanowires 560 can be grown from one of the first horizontal surface 542 and second horizontal surface 552, and one or more horizontal nanowires 562 can be grown from one of the first vertical surface 554 and second vertical surface 556, and interconnect between the first horizontal surface 542 and second horizontal surface 552, and between the first vertical surface 554 and second vertical surface 556. In another embodiment, the device can include one or more interconnected nanowires and one or more continuously-extending nanowires. Bragg mirrors are not included in the photodetector and light follows the same path as in the laser configuration, but travels in an opposite direction. Accordingly, the opto-electronic device 500 can function as a polarization-sensing photodetector. The opto-electronic device can be used in polarization division multiplexed links for secured communications, for example.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A nanowire-based opto-electronic device, comprising:
   a main substrate;
   a first protrusion including a first insulating layer formed on the main substrate and a first crystal material layer formed on the first insulating layer, wherein the first crystal material layer is isolated from the main substrate by the first insulating layer and includes at least one first surface;
   a second protrusion including a second insulating layer formed on the main substrate and a second crystal material layer formed on the second insulating layer, wherein the second crystal material layer is isolated from the main substrate by the second insulating layer and includes at least one second surface, each second surface being electrically isolated from a respective first surface; and
   at least one first nanowire connecting at least one opposing first pair of the first and second surfaces in a bridging configuration, wherein the first nanowire is grown from the first and second surfaces, and interconnects between the first and second surfaces, of the first pair of the first and second surfaces.

2. The nanowire-based opto-electronic device of claim 1, further comprising:
   a first Bragg mirror formed on or adjacent at least one first surface; and
   a second Bragg mirror formed on or adjacent at least one second surface opposite the at least one first surface;
   at least one second nanowire grown from the first surface or the second surface of at least one opposing second pair of the first and second surfaces;
   wherein each opposing pair of the first and second Bragg mirrors defines an optical cavity comprising at least one second nanowire; and
   wherein the first and second nanowires comprise a group III-V compound semiconductor material.

3. The nanowire-based opto-electronic device of claim 2, wherein the first nanowire and/or the second nanowire comprises an active region comprising a quantum dot or a heterojunction.

4. The nanowire-based opto-electronic device of claim 1, comprising a plurality of the first nanowires connecting at least the first pair of the first and second surfaces in a bridging configuration, wherein the first nanowires are grown from, and interconnect between, the first and second surfaces of the first pair of the first and second surfaces, wherein the first nanowires comprise a group III-V compound semiconductor material.

5. The nanowire-based opto-electronic device of claim 1, wherein:
   electrical contacts are formed on or in each of the first and second protrusions.

6. The nanowire-based opto-electronic device of claim 1, wherein each of the first and second crystal material layers comprises a non-single crystal material selected from the group consisting of polycrystalline silicon, amorphous silicon, microcrystalline silicon, diamond and diamond-like carbon.

7. The nanowire-based opto-electronic device of claim 6, wherein the main substrate comprises a single crystal material.

8. The nanowire-based opto-electronic device of claim 1, wherein:
   the first and second crystal material layers each comprise a single or non-single crystal material, and
   the main substrate comprises a single crystal material or a non-single crystal material selected from the group consisting of microcrystalline silicon, amorphous silicon, glass, quartz, polymers and metals.

* * * * *

UNITED STATES PATENT AND TRADEMARK OFFICE
CERTIFICATE OF CORRECTION

PATENT NO. : 8,212,235 B2  Page 1 of 1
APPLICATION NO. : 11/790446
DATED : July 3, 2012
INVENTOR(S) : Shih-Yuan Wang et al.

It is certified that error appears in the above-identified patent and that said Letters Patent is hereby corrected as shown below:

Title Page, Item (54) in column 1, line 2, Title, and Column 1, line 2, delete "DEVICE" and insert -- DEVICES --, therefor.

Signed and Sealed this
Fifteenth Day of January, 2013

David J. Kappos
*Director of the United States Patent and Trademark Office*